United States Patent
Seaberg et al.

(10) Patent No.: US 9,467,122 B2
(45) Date of Patent: Oct. 11, 2016

(54) SWITCHING SCHEME TO EXTEND MAXIMUM INPUT VOLTAGE RANGE OF A DC-TO-DC VOLTAGE CONVERTER

(71) Applicants: Charles E. Seaberg, Austin, TX (US); Chang Joon Park, Austin, TX (US)

(72) Inventors: Charles E. Seaberg, Austin, TX (US); Chang Joon Park, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 14/472,903

(22) Filed: Aug. 29, 2014

(65) Prior Publication Data

US 2016/0065047 A1 Mar. 3, 2016

(51) Int. Cl.
| | |
|---|---|
| H03K 3/00 | (2006.01) |
| H03K 3/012 | (2006.01) |
| H02M 1/32 | (2007.01) |
| H02M 3/158 | (2006.01) |

(52) U.S. Cl.
CPC .............. *H03K 3/012* (2013.01); *H02M 1/32* (2013.01); *H02M 3/158* (2013.01); *H02M 3/1588* (2013.01)

(58) Field of Classification Search
None
See application file for complete search history.

(56) References Cited

U.S. PATENT DOCUMENTS

| | | | |
|---|---|---|---|
| 5,552,695 A | 9/1996 | Schwartz | |
| 5,949,226 A * | 9/1999 | Tanaka | H02M 3/156 323/283 |
| 7,254,000 B1 | 8/2007 | Smith et al. | |
| 8,203,320 B2 | 6/2012 | Leman et al. | |
| 8,319,528 B2 * | 11/2012 | Kimura | G09G 3/3677 326/87 |
| 9,223,328 B2 * | 12/2015 | Yanagida | G05F 1/10 |
| 2006/0001480 A1 | 1/2006 | Barkley et al. | |
| 2008/0273354 A1 * | 11/2008 | Ryu | H02M 3/156 363/21.06 |
| 2009/0002050 A1 * | 1/2009 | Chen | H03K 17/0822 327/333 |
| 2011/0133787 A1 * | 6/2011 | Ball | H02M 3/1588 327/103 |
| 2014/0070780 A1 * | 3/2014 | Yanagida | H02M 3/1588 323/271 |
| 2014/0176093 A1 * | 6/2014 | Nomiyama | H02M 3/158 323/235 |

(Continued)

OTHER PUBLICATIONS

Ma et al "Fast-Transient PCCM Switching Converter With Freewheel Switching Control", IEEE Transactions on Circuits and Systems-II,Sep. 2007, pp. 825-829, Express Briefs, vol. 54, No. 9.

*Primary Examiner* — Lincoln Donovan
*Assistant Examiner* — Khareem E Almo

(57) ABSTRACT

A circuit includes a first transistor having a first current electrode coupled to a first power supply node, a second current electrode coupled to a switching node; a second transistor having a first current electrode coupled to the switching node, a second current electrode coupled to a second power supply node; an inductor having a first terminal coupled to the switching node, a second terminal coupled to an output node; a third transistor having a first current electrode coupled to the output node, a second current electrode coupled to the switching node; a driver circuit configured to transition the switching node from a first voltage to a second voltage by turning on the third transistor to couple the output node to the switching node during a first time period, turning on the first transistor to couple the first power supply node to the switching node during a second time period.

20 Claims, 3 Drawing Sheets

(56) References Cited

U.S. PATENT DOCUMENTS

| | | | | |
|---|---|---|---|---|
| 2014/0232454 A1* | 8/2014 | Gillberg | H02M 3/156 | 327/540 |
| 2014/0266097 A1* | 9/2014 | Chuang | H02M 3/1588 | 323/271 |
| 2015/0042300 A1* | 2/2015 | Peker | H02M 3/156 | 323/274 |
| 2015/0115925 A1* | 4/2015 | Teh | G04F 10/005 | 323/283 |
| 2015/0123641 A1* | 5/2015 | Dalton | H02J 7/0063 | 323/299 |
| 2015/0155780 A1* | 6/2015 | Searles | G05F 1/46 | 327/541 |
| 2015/0188498 A1* | 7/2015 | Yuan | H04R 3/04 | 327/109 |
| 2015/0200661 A1* | 7/2015 | Jeon | H03K 17/161 | 327/109 |
| 2015/0207409 A1* | 7/2015 | Nakao | H02M 3/158 | 323/271 |
| 2015/0222172 A1* | 8/2015 | Thakur | H02M 1/08 | 323/311 |
| 2015/0236588 A1* | 8/2015 | Branca | H02M 3/158 | 323/271 |
| 2015/0364983 A1* | 12/2015 | Peting | H02M 1/08 | 327/108 |

* cited by examiner

SWITCHING SCHEME TO EXTEND MAXIMUM INPUT VOLTAGE RANGE OF A DC-TO-DC VOLTAGE CONVERTER

BACKGROUND

1. Field

This disclosure relates generally to integrated circuit voltage converters, and more specifically, to reducing overvoltage stress during voltage switching.

2. Related Art

Voltage converters, such as buck converters, utilize switching components, such as transistors. The gate oxide in transistors has generally been decreasing over subsequent transistor generations, which reduces the transistor voltage tolerance. At the same time, battery voltages have not decreased, which have a maximum operating voltage that may exceed the transistor voltage tolerance, resulting in efficiency loss or even destruction of the transistors.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

The following sets forth a detailed description of various embodiments intended to be illustrative of the invention and should not be taken to be limiting.

Figure 1:
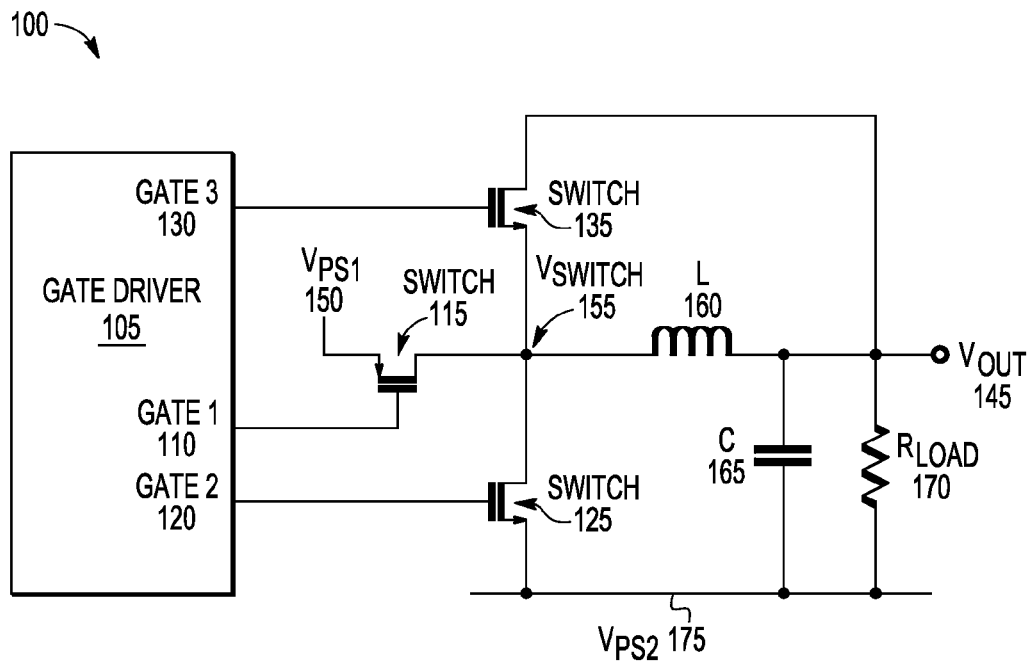
FIG. 1 illustrates a block diagram depicting an example voltage converter system in which the present disclosure is implemented, according to some embodiments.

FIG. 1 illustrates a block diagram depicting various integrated circuit components of an example voltage converter system 100 in which the present disclosure is implemented. Voltage converter system 100 includes gate driver circuit 105, switch 115, switch 125, switch 135, inductor (L) 160, capacitor (C) 165, and a load resistance ($F_{LOAD}$) 170. $R_{LOAD}$ is any appropriate electrical load, including an inductive load, capacitive load, resistive load, an integrated circuit, an electronic component or device, and any combination thereof. Voltage converter system 100 also includes a first power supply voltage ($V_{PS1}$) node 150 coupled to a first power supply voltage source, a switching voltage ($V_{SWITCH}$) node 155, and an output voltage ($V_{OUT}$) node 145. The first power supply voltage source may be any appropriate voltage source, such as a battery supply voltage, to drive load 170. For example, VPS 150 may supply a voltage ranging from 4.2V to 3.6V, depending on design considerations and circuit component restraints. Various components of voltage converter system 100 are also coupled to a second power supply voltage ($V_{PS2}$) node 175 coupled to a second power supply voltage source. The second power supply voltage can be any appropriate voltage source that provides a voltage amount less than the first power supply voltage, such as zero (e.g., ground) or a negative voltage value. The first and second power supply voltages are also referred to herein as input voltages to the voltage converter system 100. The output voltage $V_{OUT}$ produced by voltage converter system 100 is an amount of voltage between the first and second power supply voltages (e.g., less than the first power supply voltage and greater than the second power supply voltage).

Gate driver circuit 105 includes appropriate circuitry configured to generate control signals to drive the control gates of switches 115, 125, and 135. Gate driver circuit 105 includes a first gate (GATE 1) voltage node 110 coupled to a control gate of switch 115, a second gate (GATE 2) voltage node 120 coupled to a control gate of switch 125, and a third gate (GATE 3) voltage node 130 coupled to a control gate of switch 135. In some embodiments, switches 115, 125, and 135 are implemented using a suitable type of transistor. For example, in some embodiments, switch 115 is a p-channel transistor, switch 125 is an n-channel transistor, and switch 135 is an n-channel transistor 125.

Switch 115 has a first terminal coupled to $V_{PS1}$ node 150 and a second terminal coupled to $V_{SWITCH}$ node 155. Switch 115 implements a high side switch in the voltage converter system 100. Switch 125 has a first terminal coupled to $V_{SWITCH}$ node 155 and a second terminal coupled to $V_{PS2}$ node 175. Switch 125 implements a low side switch in the voltage converter system 100. Switch 135 has a first terminal coupled to $V_{OUT}$ node 145 and a second terminal coupled to $V_{SWITCH}$ node 155. Switch 135 implements a biasing switch in the voltage converter system 100.

Inductor 160 has a first terminal coupled to $V_{SWITCH}$ node 155 and a second terminal coupled to $V_{OUT}$ node 145. Capacitor 165 has a first terminal coupled to $V_{OUT}$ node 145 and a second terminal coupled to $V_{PS2}$ node 175. Load 170 has a first terminal coupled to $V_{OUT}$ node 145 and a second terminal coupled to $V_{PS2}$ node 175.

Voltage converter system 100 implements a voltage conversion process that has a number of sequential time periods or phases, that are further discussed below. The voltage converter system cycles through the voltage conversion process (e.g., repeating the number of sequential time periods) and achieves steady state after an initial transient state. During the time periods, switches 115, 125, and 135 are turned on and off at various points by gate driver 105 in order to step down the first power supply voltage to an output voltage $V_{OUT}$ (in steady state) that is less than the first power supply voltage (and greater than the second power supply voltage). In a traditional voltage converter, the maximum voltage drop across the high side and low side switches is the difference between the first and second power supply voltages, which may likely exceed the switches' voltage tolerance. The present disclosure uses output voltage $V_{OUT}$ as an intermediate bias voltage to "break up" the voltage drop across the switches into smaller voltage drops that can be better tolerated by the switches. This reduces overvoltage stress on the switches, improves endurance of the switches, and also allows for a greater range of input voltages that can be handled by the switches in voltage converter system 100.

During a first time period of voltage conversion, switch 115 is turned on by gate driver 105 applying an appropriate voltage to switch 115's control gate to activate switch 115, which completes the connection between $V_{PS1}$ node 150 and switching node 155. Switches 125 and 135 are turned off at this time by gate driver 105 applying appropriate voltages to the control gates of switches 125 and 135 to deactivate switches 125 and 135. When switch 115 is turned on, the voltage at switching node 155 increases to the first power supply voltage ($V_{PS1}$). Current flow also increases across inductor 160, which produces an opposing voltage across its terminals. This opposing voltage counteracts the $V_{PS1}$ voltage and produces a reduced voltage $V_{OUT}$ at output node 145, which drives load 170. Capacitor 165 also stores voltage $V_{OUT}$ and smoothes out any fluctuations. It is noted that in some embodiments, capacitor 165 is preconditioned to store a voltage level of $V_{PS1}$ to reduce stress on voltage converter system 100 during the initial transient state when the connection between $V_{PS1}$ node 150 and switching node 155 is closed during the first time period. In other embodiments, capacitor 165 is not preconditioned and circuit components of voltage converter are chosen to withstand the stress experienced during the initial transient state.

During a second time period subsequent to the first time period, switch 115 is turned off by gate driver 105 applying an appropriate voltage to switch 115's control gate to deactivate switch 115, which opens the connection between $V_{PS1}$ node 150 and switching node 155. Switch 115 is turned off while current flow is still changing across inductor 160 (e.g., does not fall to zero) to ensure that $V_{OUT}$ voltage is less than $V_{PS1}$ voltage. When switch 115 is turned off, the current flow decreases across inductor 160, which produces a change in voltage across the inductor and maintains the output voltage $V_{OUT}$ that continues to drives load 170. Switch 125 remains off at this time. Also during the second time period, switch 135 is turned on by gate driver 105 applying an appropriate voltage to switch 135's control gate to activate switch 135, which completes the connection between output node 145 and switching node 155 (e.g., a feedback connection). Switch 135 is turned on (or activated) after switch 115 is turned off (or deactivated). In some embodiments, switch 135 is turned on after current stops flowing between $V_{PS1}$ node 150 and switching node 155 through switch 115 (e.g., switch 115 is completely off). In other embodiments, switch 135 is turned on after a substantial amount of the current stops flowing between $V_{PS1}$ node 150 and switching node 155 through switch 115 (e.g., switch 115 is turned off, although some residual current continues to flow between $V_{PS1}$ node 150 and switching node 155 through switch 115). During this second time period, the voltage $V_{OUT}$ at output node 145 is used to pre-bias switching node 155 before voltage converter system 100 steps switching node 155 down to the second power supply voltage (e.g., to ground). Also during this second time period, current flows from output node 145 through closed switch 135 (e.g., through the feedback connection) and through inductor 160, which prevents large voltage spikes from occurring in the voltage converter system 100.

During a third time period subsequent to the second time period, switch 135 is turned off by gate driver 105 applying an appropriate voltage to switch 135's control gate to deactivate switch 135, which opens the connection between output node 145 and switching node 155. Switch 115 remains off at this time. Also during the third time period, switch 125 is turned on by gate driver 105 applying an appropriate voltage to switch 125's control gate to activate switch 125, which completes the connection between switching node 155 and $V_{PS2}$ node 175. Switch 125 is turned on (activated) after switch 135 is turned off (deactivated). In some embodiments, switch 125 is turned off after current stops flowing between output node 145 and switching node 155 through switch 135 (e.g., switch 135 is completely off). In other embodiments, switch 125 is turned on after a substantial amount of the current stops flowing between output node 145 and switching node 155 (e.g., switch 135 is turned off, although some residual current continues to flow between output node 145 and switching node 155). During this third time period, current flows from switching node 155 to $V_{PS2}$ node 175, and the voltage level at switching node 155 is reduced to the second power supply voltage (e.g., ground).

During a fourth time period subsequent to the third time period, switch 125 is turned off by gate driver 105 applying an appropriate voltage to switch 125's control gate to deactivate switch 125, which opens the connection between switching node 155 and $V_{PS2}$ node 175. Switch 115 remains off at this time. Also during the fourth time period, switch 135 is turned on by gate driver 105 to complete the connection between output node 145 and switching node 155 (e.g., the feedback connection). Switch 135 is turned on (or activated) after switch 125 is turned off (or deactivated). In some embodiments, switch 135 is turned on after current stops flowing between switching node 155 and $V_{PS2}$ node 175 through switch 125 (e.g., switch 125 is completely off). In other embodiments, switch 135 is turned on after a substantial amount of the current stops flowing between switching node 155 and $V_{PS2}$ node 175 through switch 125 (e.g., switch 125 is turned off, although some residual current continues to flow between switching node 155 and $V_{PS2}$ node 175 through switch 125). During this fourth time period, the voltage $V_{OUT}$ at output node 145 is used to pre-bias switching node 155 before voltage converter system 100 steps switching node 155 up to the first power supply voltage (e.g., to $V_{PS1}$). Also during this fourth time period, current flows from output node 145 through closed switch 135 (e.g., through the feedback connection) and through inductor 160, which prevents large voltage spikes from occurring in the voltage converter system 100.

The voltage converter system 100 returns to the first time period after the fourth time period, where during the (repeated) first time period, switch 135 is turned off, switch 125 remains off, switch 115 is turned on, and the voltage at switching node 155 is increased to a voltage level of $V_{PS1}$. In this manner, the voltage converter system 100 continues to cycle through the four time periods.

Figure 2:
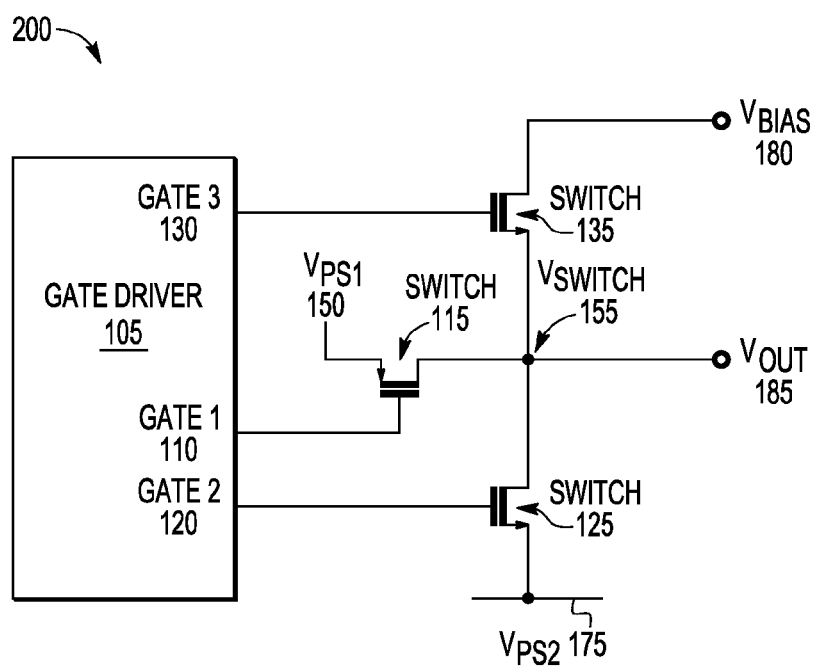
FIG. 2 illustrates a block diagram depicting another example voltage converter system in which the present disclosure is implemented, according to some embodiments.

FIG. 2 illustrates a block diagram depicting various integrated circuit components of another example voltage converter system 200 in which the present disclosure is implemented. Voltage converter system 200 includes gate driver circuit 105, switch 115, switch 125, switch 135, first power supply voltage ($V_{PS1}$) node 150, second power supply voltage ($V_{PS2}$) node 175, and switching voltage ($V_{SWITCH}$) node 155, as described above. Voltage converter system 200 also includes a bias voltage ($V_{BIAS}$) node 180 coupled to a bias voltage source and an output voltage ($V_{OUT}$) node 185. The bias voltage source may be any appropriate voltage source between the first and second power supply voltages and serves as an intermediate bias voltage to break up the maximum voltage drop (e.g., the difference between the first and second power supply voltages) across the switches into smaller voltage drops that can be better tolerated by the switches. $V_{OUT}$ node 185 is coupled to $V_{SWITCH}$ node 155, where the output voltage $V_{OUT}$ produced by voltage converter system 200 is $V_{SWITCH}$.

As similarly discussed above, voltage converter system 200 cycles through four time periods. During a first time period of voltage conversion, switch 115 is turned on by gate driver 105, completing the connection between $V_{PS1}$ node 150 and switching node 155. Switches 125 and 135 are turned off at this time by gate driver 105. When switch 115 is turned on, the voltage at switching node 155 increases to the first power supply voltage.

During a second time period subsequent to the first time period, switch 115 is turned off by gate driver 105, opening the connection between $V_{PS1}$ node 150 and switching node 155. Switch 125 remains off at this time. Also during the second time period, switch 135 is turned on by gate driver 105, completing the connection between $V_{BIAS}$ node 180 and switching node 155. Switch 135 is turned on after switch 115 is turned off. In some embodiments, switch 135 is turned on after current stops flowing between $V_{PS1}$ node 150 and switching node 155 through switch 115 (e.g., switch 115 is completely off). In other embodiments, switch 135 is turned on after a substantial amount of the current stops flowing between $V_{PS1}$ node 150 and switching node 155 through switch 115 (e.g., switch 115 is turned off, although some residual current continues to flow between $V_{PS1}$ node 150 and switching node 155 through switch 115). During this second time period, the bias voltage at $V_{BIAS}$ node 180 is used to pre-bias switching node 155 before voltage converter system 200 steps switching node 155 down to the second power supply voltage (e.g., to ground).

During a third time period subsequent to the second time period, switch 135 is turned off by, opening the connection between $V_{BIAS}$ node 180 and switching node 155. Switch 115 remains off at this time. Also during the third time period, switch 125 is turned on, completing the connection between switching node 155 and $V_{PS2}$ node 175. Switch 125 is turned on after switch 135 is turned off. In some embodiments, switch 135 is turned off after current stops flowing between $V_{BIAS}$ node 180 and switching node 155 through switch 135 (e.g., switch 135 is completely off). In other embodiments, switch 125 is turned on after a substantial amount of the current stops flowing between $V_{BIAS}$ node 180 and switching node 155 (e.g., switch 135 is turned off, although some residual current continues to flow between $V_{BIAS}$ node 180 and switching node 155). During this third time period, current flows from switching node 155 to $V_{PS2}$ node 175, and the voltage level at switching node 155 is reduced to the second power supply voltage (e.g., ground).

During a fourth time period subsequent to the third time period, switch 125 is turned off, opening the connection between switching node 155 and $V_{PS2}$ node 175. Switch 115 remains off at this time. Also during the fourth time period, switch 135 is turned on to complete the connection between $V_{BIAS}$ node 180 and switching node 155. Switch 135 is turned on after switch 125 is turned off. In some embodiments, switch 135 is turned on after current stops flowing between switching node 155 and $V_{PS2}$ node 175 through switch 125 (e.g., switch 125 is completely off). In other embodiments, switch 135 is turned on after a substantial amount of the current stops flowing between switching node 155 and $V_{PS2}$ node 175 through switch 125 (e.g., switch 125 is turned off, although some residual current continues to flow between switching node 155 and $V_{PS2}$ node 175 through switch 125). During this fourth time period, the bias voltage at $V_{BIAS}$ node 180 is used to pre-bias switching node 155 before voltage converter system 200 steps switching node 155 up to the first power supply voltage.

The voltage converter system 200 returns to the first time period after the fourth time period, where during the (repeated) first time period, switch 135 is turned off, switch 125 remains off, switch 115 is turned on, and the voltage at switching node 155 is increased to the first power supply voltage.

Figure 3:
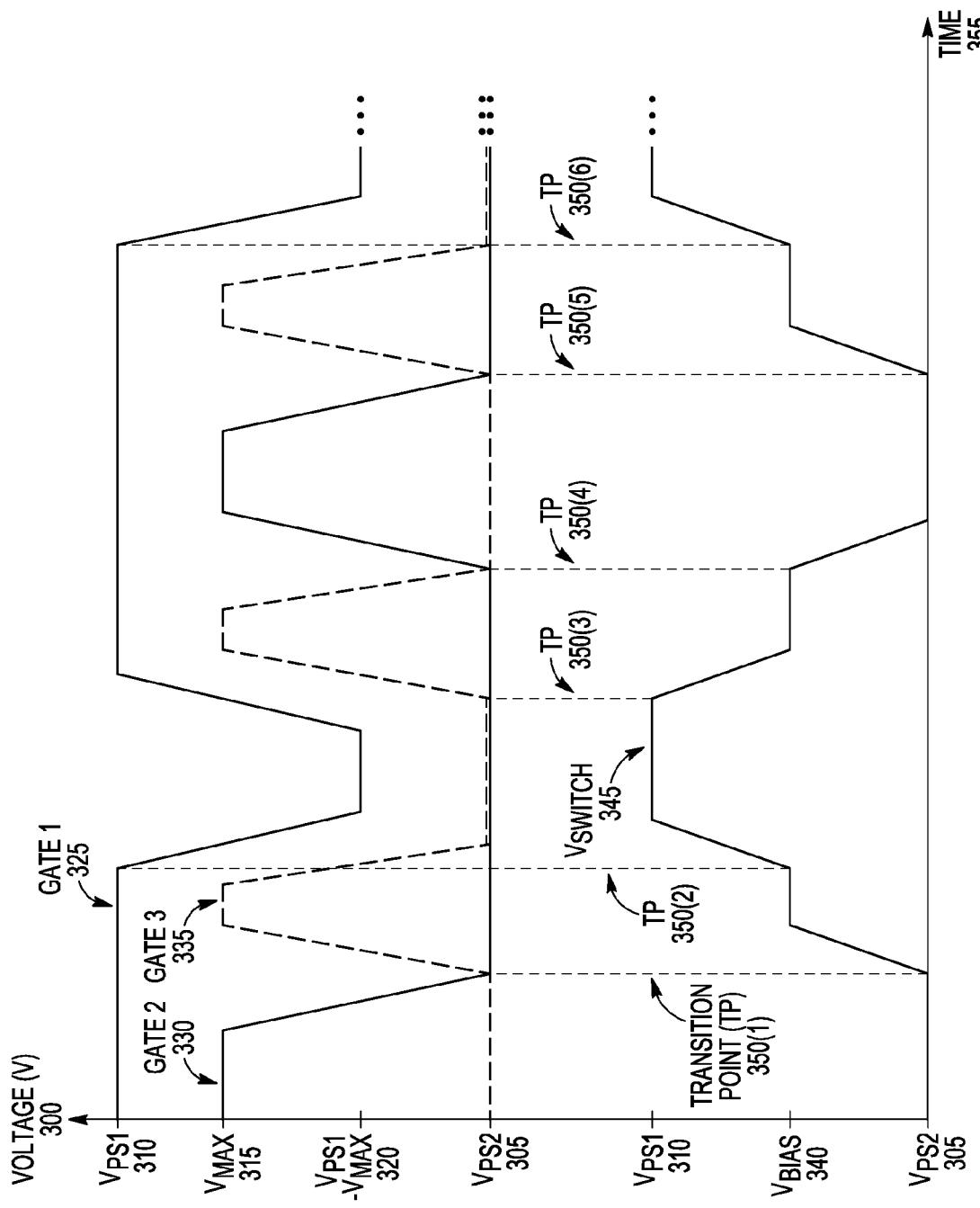
FIG. 3 illustrates waveforms at a plurality of nodes within a voltage converter system that implements the present disclosure, according to some embodiments.

FIG. 3 illustrates waveforms at a plurality of nodes within a voltage converter system that implements the present disclosure. The node voltages are illustrated over time 355 as the voltage converter system cycles through the four time periods discussed above. The voltages provided by gate driver 105 are illustrated in the top half of FIG. 3, and the voltage at switching node 155 is illustrated in the bottom half of FIG. 3. Gate 1 curve 325 depicts the voltage of gate 1 node 110 that is applied at the control gate of (high side) switch 115, gate 2 curve 330 depicts the voltage of gate 2 node 120 that is applied at the control gate of (low side) switch 125, and gate 3 curve 335 depicts the voltage of gate 3 node 130 that is applied at the control gate of (biasing) switch 135. In the embodiment shown, switch 115 is implemented with active low logic, and switches 125 and 135 are implemented with active high logic. Switch 115 is turned off by a high signal of $V_{PS1}$ 310 and is turned on by a low signal of $V_{PS1}$–Vmax 320. Switches 125 and 135 are turned on by a high signal of Vmax 315 and are turned off by a low signal of $V_{PS2}$ 305 (e.g., ground). $V_{SWITCH}$ curve 345 depicts the voltage at switching node 155, which is further described below.

At an initial time before transition point (TP) 350(1): gate 1 curve 325 is high, indicating that switch 115 is off; gate 2 curve 330 is high, indicating that switch 125 is on; and gate 3 curve 335 is low, indicating that switch 135 is off. Switch 125 couples switching node 155 to $V_{PS2}$ node 175 and the voltage $V_{SWITCH}$ 345 at switching node 155 is $V_{PS2}$ 305 (e.g., ground).

At TP 350(1): switch 115 is still off; gate 2 curve 330 has transitioned low, indicating that switch 125 is turned off and switching node 155 is no longer coupled to $V_{PS2}$ node 175; and gate 3 curve 335 begins to transition high, indicating that switch 135 is beginning to turn on and couples switching node 155 to a bias voltage source. In response to switch 135 being turned on, $V_{SWITCH}$ 345 is raised to a bias voltage $V_{BIAS}$ 340. In some embodiments, switch 135 couples switching node 155 to output voltage node 145 (as illustrated in FIG. 1), introducing a bias voltage of $V_{OUT}$ to the switching node 155. In other embodiments, switch 135 couples switching node 155 to bias voltage node 180 (as illustrated in FIG. 2), introducing a bias voltage of $V_{BIAS}$ to the switching node 155.

At TP 350(2): gate 1 curve 325 begins to transition low, indicating that switch 115 is beginning to turn on; switch 125 is still off; and gate 3 curve 335 is in mid-transition to low, indicating that switch 135 is being turned off and switching node 155 is no longer coupled to the bias voltage source (either output voltage node 145 or bias voltage node 180). In response to switch 115 being turned on, switching node 155 is coupled to $V_{PS1}$ node 150 and $V_{SWITCH}$ 345 is raised to voltage $V_{PS1}$ 310.

At TP 350(3): gate 1 curve 325 has transitioned high, indicating switch 115 is off and no longer couples switching node 155 to $V_{PS1}$ node 150; switch 125 is still off; and gate 3 curve 335 begins to transition high, indicating that switch 135 is beginning to turn on and couples switching node 155 to the bias voltage source. In response to switch 135 being turned on, $V_{SWITCH}$ 345 is lowered to $V_{BIAS}$ 340, which in some embodiments is $V_{OUT}$ (as illustrated in FIG. 1) and in other embodiments is $V_{BIAS}$ (as illustrated in FIG. 2).

At TP 350(4): switch 115 is still off; gate 3 curve 335 has transitioned low, indicating switch 135 is off and switching node 155 is no longer coupled to the bias voltage source; and gate 2 curve 330 begins to transition high, indicating that switch 125 is beginning to turn on. In response to switch 125 being turned on, switching node 155 is coupled to $V_{PS2}$ node 175 and $V_{SWITCH}$ 345 is lowered to $V_{PS2}$ 305.

At TP 350(5), the cycle repeats. Switch 115 is still off; gate 2 curve 330 has transitioned low, indicating switch 125 is off and switching node 155 is no longer coupled to $V_{PS2}$ node 175; and gate 3 curve 335 begins to transition high, indicating that switch 135 is beginning to turn on and couples switching node 155 to the bias voltage source. In response to switch 135 being turned on, $V_{SWITCH}$ 345 is raised to $V_{BIAS}$ 340, which in some embodiments is $V_{OUT}$ (as illustrated in FIG. 1) and in other embodiments is $V_{BIAS}$ (as illustrated in FIG. 2).

Figure 4:
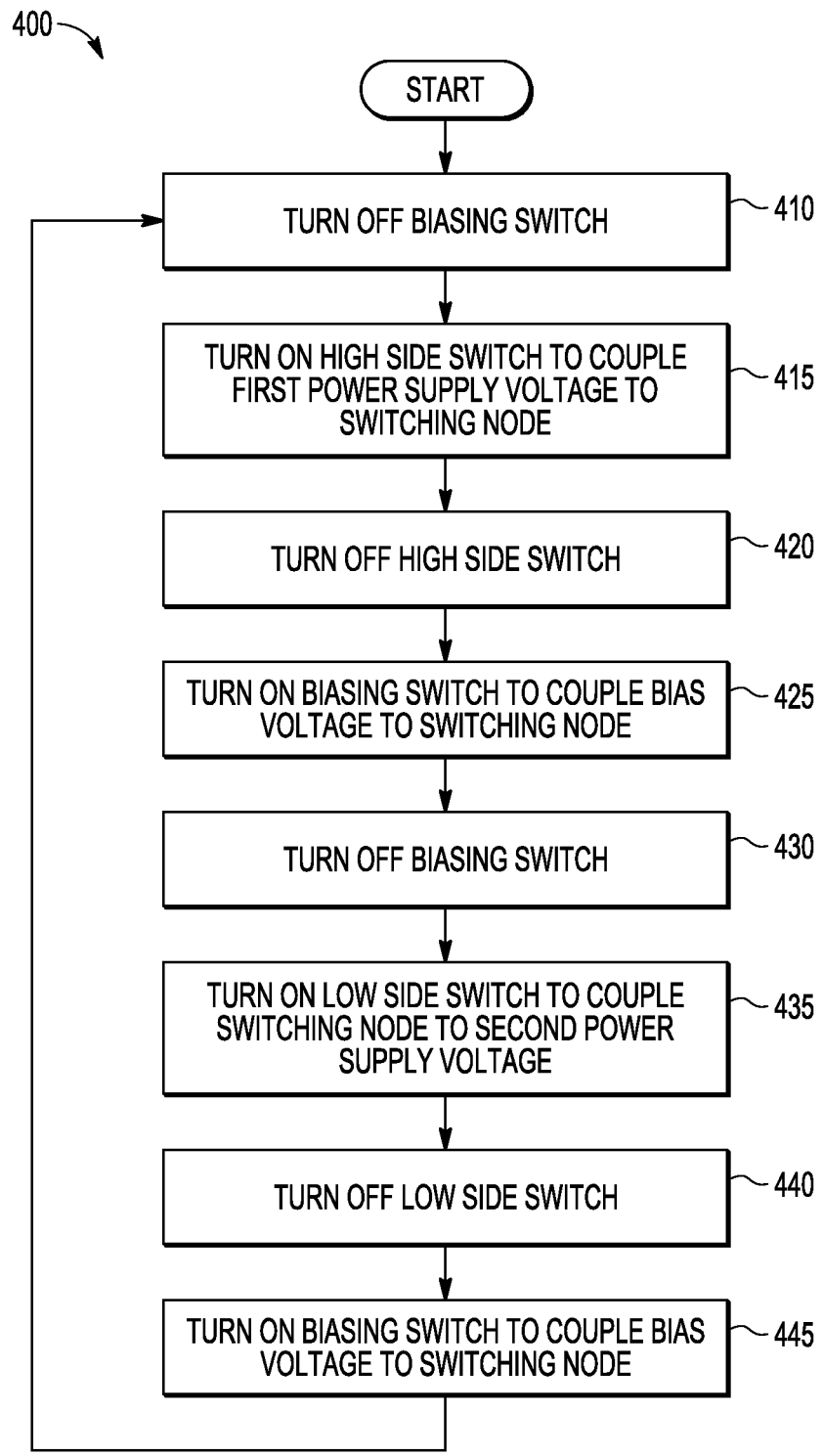
FIG. 4 illustrates a flowchart depicting a voltage conversion process implemented in a voltage converter system by the present disclosure, according to some embodiments.

FIG. 4 illustrates a flowchart depicting a voltage conversion process implemented in the voltage converter system by the present disclosure. The process may be implemented by logic circuitry in the gate driver to control high side, low side, and biasing switches in the voltage converter system to follow the various time periods or phases, as described above. The process starts at operation 410, where the gate driver turns off the biasing switch. Operation 410 corresponds to the beginning of the first time period, as described above. It is noted that during operation 410, the high side and low side switches are also off.

The process continues to operation 415, where the gate driver turns on the high side switch to couple the first power supply voltage to the switching node. It is noted that operation 415 corresponds to TP 350(2) in FIG. 3.

The process continues to operation 420, where the gate driver turns off the high side switch, decoupling the first power supply voltage from the switching node. Operation 415 corresponds to the beginning of the second time period, as described above.

The process continues to operation 425, where the gate driver turns on the biasing switch to couple the bias voltage source to the switching node. In some embodiments, the bias voltage is $V_{OUT}$ (as illustrated in FIG. 1) and in other embodiments, the bias voltage is $V_{BIAS}$ (as illustrated in FIG. 2). It is noted that operation 425 corresponds to TP 350(3) in FIG. 3.

The process continues to operation 430, where the gate driver turns off the biasing switch, decoupling the bias voltage source from the switching node. Operation 430 corresponds to the beginning of the third time period, as described above.

The process continues to operation 435, where the gate driver turns on the low side switch to couple the switching node to the second power supply voltage. It is noted that operation 435 corresponds to TP 350(4) in FIG. 3.

The process continues to operation 440, where the gate driver turns off the low side switch, decoupling the switching node from the second power supply voltage. Operation 440 corresponds to the beginning of the fourth time period, as described above.

The process continues to operation 445, where the gate driver turns on the biasing switch to couple the bias voltage source to the switching node. Operation 445 corresponds to TP 350(5) in FIG. 3.

The process returns to operation 410, where the gate driver turns off the biasing switch, decoupling the bias voltage source from the switching node.

By now it should be appreciated that there has been provided embodiments of integrated circuits and methods for transitioning a voltage at a switching node of a voltage converter system from a first voltage to a second voltage using an intermediate bias voltage, which reduces overvoltage stress of the switches used in the voltage converter system.

The present disclosure provides an embodiment of an integrated circuit including a first transistor having a control electrode, a first current electrode coupled to a first power supply node, and a second current electrode coupled to a switching node; and a second transistor having a control electrode, a first current electrode coupled to the switching node, and a second current electrode coupled to a second power supply node. The integrated circuit also includes an inductor having a first terminal coupled to the switching node, and a second terminal coupled to an output node; and a third transistor having a first current electrode coupled to the output node, a control electrode, and a second current electrode coupled to the switching node. The integrated circuit also includes a driver circuit configured to transition the switching node from a first voltage to a second voltage by turning on the third transistor to couple the output node to the switching node during a first time period, and turning on the first transistor to couple the first power supply node to the switching node during a second time period subsequent to the first time period.

One aspect of the above embodiment further provides that the first voltage is a voltage at the second power supply node and the second voltage is a voltage at the first power supply node.

Another aspect of the above embodiment further provides that the driver circuit is configured to transition the switching node from the second voltage to the first voltage by turning on the third transistor to couple the output node to the switching node during a third time period subsequent to the second time period and turning on the second transistor to couple the second power supply node to the switching node during a fourth time period subsequent to the third time period. A further aspect provides that the driver circuit is configured to: prior to turning on the third transistor during the first time period, turn off the first transistor; prior to turning on the first transistor during the second time period, turn off the third transistor; prior to turning on the third transistor during the third time period, turn off the first transistor; and prior to turning on the second transistor during the second time period, turn off the third transistor. Another further aspect provides that the first, second, third, and fourth time periods are non-overlapping.

Another aspect of the above embodiment further provides that the driver circuit is configured to: prior to turning on the third transistor during the first time period, turn off the first transistor; and prior to turning on the first transistor during the second time period, turn off the third transistor. Another aspect further provides that the first and second time periods are non-overlapping.

Another aspect of the above embodiment further provides that after the first time period, the switching node is at a third voltage that has a value between the first and second voltages. A further aspect provides that a voltage difference between the second voltage and the third voltage is less than a maximum voltage supported by process technology of the integrated circuit, and a voltage difference between the first voltage and the third voltage is less than the maximum voltage.

Another aspect of the above embodiment further provides that the first power supply node is further characterized as a positive battery node. Another aspect further provides that the second power supply node is further characterized as a ground node. Another aspect further provides that the integrated circuit further includes a capacitor having a first terminal coupled to the output node and a second terminal coupled to the second power supply node.

The present disclosure also provides an embodiment of an integrated circuit including a first transistor having a control electrode, a first current electrode coupled to a first power supply node, and a second current electrode coupled to a switching node; a second transistor having a control electrode, a first current electrode coupled to the switching node, and a second current electrode coupled to a second power supply node; and a third transistor having a first current electrode coupled to a third power supply node, a control electrode, and a second current electrode coupled to the switching node. The integrated circuit also includes a driver circuit configured to transition the switching node from a first voltage to a second voltage by turning on the third transistor to couple the third power supply node to the switching node during a first time period, and turning on the first transistor to couple the first power supply node to the switching node during a second time period subsequent to the first time period.

One aspect of the above embodiment further provides that the first voltage is a voltage at the second power supply node and the second voltage is a voltage at the first power supply node. Another aspect further provides that the driver circuit is configured to: prior to turning on the third transistor during the first time period, turn off the first transistor; and prior to turning on the first transistor during the second time period, turn off the third transistor.

Another aspect of the above embodiment further provides that after the first time period, the switching node is at a third voltage that has a value between the first and second voltages. Another aspect further provides that the first power supply node is further characterized as a positive battery node. Another aspect further provides that the second power supply node is further characterized as a ground node.

The present disclosure also provides an embodiment of a method for transitioning a voltage at a switching node from a first voltage to a second voltage. The method includes coupling a first power supply node to the switching node by way of a first transistor to transition the switching node from the first voltage to a third voltage which has a value between the first and second voltages; decoupling the first power supply node from the switching node; and coupling a second power supply node to the switching node by way of a second transistor to transition the switching node from the third voltage to the second voltage.

One aspect of the above method embodiment further provides that the method further includes decoupling the second power supply node from the switching node; coupling the first power supply node to the switching node by way of the first transistor to transition the switching node from the second voltage to the third voltage; decoupling the first power supply node from the switching node; and coupling the second power supply node to the switching node by way of a third transistor to transition the switching node from the third voltage to the first voltage.

The semiconductor substrate described herein can be any semiconductor material or combinations of materials, such as gallium arsenide, silicon germanium, silicon-on-insulator (SOI), silicon, monocrystalline silicon, the like, and combinations of the above.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a first transistor having a control electrode, a first current electrode coupled to a first power supply node, and a second current electrode coupled to a switching node;
a second transistor having a control electrode, a first current electrode coupled to the switching node, and a second current electrode coupled to a second power supply node;
an inductor having a first terminal coupled to the switching node, and a second terminal coupled to an output node;
a third transistor having a first current electrode coupled to the output node, a control electrode, and a second current electrode coupled to the switching node; and
a driver circuit configured to transition the switching node from a first voltage to a second voltage by being further configured to:
turn on the third transistor to couple the output node to the switching node during a first time period to transition the switching node from the first voltage to a third voltage which has a value between the first and second voltages, and
turn off the third transistor to decouple the output node from the switching node and turn on the first transistor to couple the first power supply node to the switching node during a second time period subsequent to the first time period to transition the switching node from the third voltage to the second voltage.

2. The integrated circuit of claim 1, wherein the first voltage is a voltage at the second power supply node and the second voltage is a voltage at the first power supply node.

3. The integrated circuit of claim 1, wherein the driver circuit is configured to transition the switching node from the second voltage to the first voltage by being further configured to:
turn off the first transistor to decouple the first power supply node from the switching node and turn on the third transistor to couple the output node to the switching node during a third time period subsequent to the second time period to transition the switching node from the second voltage to the third voltage, and
turn off the third transistor to decouple the output node from the switching node and turn on the second transistor to couple the second power supply node to the switching node during a fourth time period subsequent to the third time period to transition the switching node from the third voltage to the first voltage.

4. The integrated circuit of claim 3, wherein the first, second, third, and fourth time periods are non-overlapping.

5. The integrated circuit of claim 1, wherein the driver circuit is configured to:
prior to turning on the third transistor during the first time period, turn off the second transistor.

6. The integrated circuit of claim 1, wherein the first and second time periods are non-overlapping.

7. The integrated circuit of claim 1, wherein a voltage difference between the second voltage and the third voltage is less than a maximum voltage supported by process technology of the integrated circuit, and a voltage difference between the first voltage and the third voltage is less than the maximum voltage.

8. The integrated circuit of claim 1, wherein the first power supply node is further characterized as a positive battery node.

9. The integrated circuit of claim 1, wherein the second power supply node is further characterized as a ground node.

10. The integrated circuit of claim 1, further comprising a capacitor having a first terminal coupled to the output node and a second terminal coupled to the second power supply node.

11. An integrated circuit comprising:
a first transistor having a control electrode, a first current electrode coupled to a first power supply node, and a second current electrode coupled to a switching node;
a second transistor having a control electrode, a first current electrode coupled to the switching node, and a second current electrode coupled to a second power supply node;
a third transistor having a first current electrode coupled to a third power supply node, a control electrode, and a second current electrode coupled to the switching node; and
a driver circuit configured to transition the switching node from a first voltage to a second voltage by being further configured to:
turn on the third transistor to couple the third power supply node to the switching node during a first time period to transition the switching node from the first voltage to a third voltage which has a value between the first and second voltages, and
turn off the third transistor to decouple the third power supply node from the switching node and turn on the first transistor to couple the first power supply node to the switching node during a second time period subsequent to the first time period to transition the switching node from the third voltage to the second voltage.

12. The integrated circuit of claim 11, wherein the first voltage is a voltage at the second power supply node and the second voltage is a voltage at the first power supply node.

13. The integrated circuit of claim 11, wherein the driver circuit is configured to:
prior to turning on the third transistor during the first time period, turn off the second transistor.

14. The integrated circuit of claim 11, wherein the first power supply node is further characterized as a positive battery node.

15. The integrated circuit of claim 11, wherein the second power supply node is further characterized as a ground node.

16. A method of transitioning a voltage at a switching node from a first voltage to a second voltage, the method comprising:
coupling a first power supply node to the switching node by way of a first transistor to transition the switching node from the first voltage to a third voltage which has a value between the first and second voltages;
decoupling the first power supply node from the switching node; and
coupling a second power supply node to the switching node by way of a second transistor to transition the switching node from the third voltage to the second voltage.

17. The method of claim 16, further comprising:
decoupling the second power supply node from the switching node;
coupling the first power supply node to the switching node by way of the first transistor to transition the switching node from the second voltage to the third voltage;
decoupling the first power supply node from the switching node; and coupling a third power supply node to the switching node by way of a third transistor to transition the switching node from the third voltage to the first voltage.

18. The integrated circuit of claim 11, wherein the driver circuit is configured to transition the switching node from the second voltage to the first voltage by being further configured to:
  turn off the first transistor to decouple the first power supply node from the switching node and turn on the third transistor to couple the output node to the switching node during a third time period subsequent to the second time period to transition the switching node from the second voltage to the third voltage, and
  turn off the third transistor to decouple the output node from the switching node and turn on the second transistor to couple the second power supply node to the switching node during a fourth time period subsequent to the third time period to transition the switching node from the third voltage to the first voltage.

19. The integrated circuit of claim 1, wherein
  during the first time period, a transition voltage at the switching node increases from the first voltage to the third voltage, and
  during the second time period, a transition voltage at the switching node increases from the third voltage to the second voltage.

20. The integrated circuit of claim 1, wherein
  during the first time period, a transition voltage at the switching node decreases from the first voltage to the third voltage, and
  during the second time period, a transition voltage at the switching node decreases from the third voltage to the second voltage.

* * * * *